United States Patent
Takahashi

(10) Patent No.: US 7,247,800 B2
(45) Date of Patent: Jul. 24, 2007

(54) MODULE CIRCUIT BOARD FOR SEMICONDUCTOR DEVICE HAVING BARRIERS TO ISOLATE I/O TERMINALS FROM SOLDER

(75) Inventor: Norio Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 196 days.

(21) Appl. No.: 10/775,232

(22) Filed: Feb. 11, 2004

(65) Prior Publication Data

US 2005/0274541 A1    Dec. 15, 2005

Related U.S. Application Data

(62) Division of application No. 10/289,358, filed on Nov. 7, 2002, now Pat. No. 6,833,509, which is a division of application No. 10/022,285, filed on Dec. 20, 2001, now Pat. No. 6,498,306, which is a division of application No. 09/450,504, filed on Nov. 30, 1999, now Pat. No. 6,420,658.

(30) Foreign Application Priority Data

Dec. 14, 1998 (JP) ................... 10-354757

(51) Int. Cl.
   *H05K 1/03* (2006.01)
(52) U.S. Cl. ..................... 174/255; 174/260
(58) Field of Classification Search ............ 174/255, 174/260, 261, 250, 254, 267, 268; 361/760, 361/777; 257/667, 671
   See application file for complete search history.

(56) References Cited

U.S. PATENT DOCUMENTS

| | | | |
|---|---|---|---|
| 4,580,193 A | 4/1986 | Edwards | 361/407 |
| 4,823,217 A | 4/1989 | Kato et al. | 360/246.8 |
| 4,859,808 A * | 8/1989 | Jeter et al. | 174/261 |
| 5,460,767 A | 10/1995 | Sanftleben et al. | 264/263 |
| 5,552,567 A | 9/1996 | Peterson et al. | 174/261 |
| 5,640,308 A | 6/1997 | Osann et al. | 361/777 |
| 5,646,068 A | 7/1997 | Wilson et al. | 437/183 |
| 5,925,445 A * | 7/1999 | Suzuki | 428/209 |
| 6,038,132 A | 3/2000 | Tokunaga et al. | 361/760 |
| 6,049,122 A | 4/2000 | Yoneda | 257/668 |
| 6,087,676 A | 7/2000 | Akram et al. | 257/48 |
| 6,143,991 A * | 11/2000 | Moriyama | 174/261 |
| 6,531,663 B1 | 3/2003 | Isenberg et al. | 174/260 |

FOREIGN PATENT DOCUMENTS

| | | | |
|---|---|---|---|
| JP | U53-115965 | | 9/1978 |
| JP | U59-078650 | | 5/1984 |
| JP | U62-044464 | | 3/1987 |
| JP | 402113596 A * | | 4/1990 |
| JP | P9-64503 | | 8/1995 |
| JP | P07-283493 | | 10/1995 |
| JP | 19980137329 | * | 4/1998 |
| JP | P10-173326 | | 6/1998 |

* cited by examiner

*Primary Examiner*—Ishwar (I. B.) Patel
(74) *Attorney, Agent, or Firm*—Junichi Mimura

(57) ABSTRACT

A module circuit board for a semiconductor device by a solder reflow process includes a plurality of pads on which the semiconductor device to be mounted, a plurality of terminals formed on a side edge of the board, a resist film covering an area between said pads and said terminal on the board, and a barrier formed between said pads and said terminals.

11 Claims, 3 Drawing Sheets

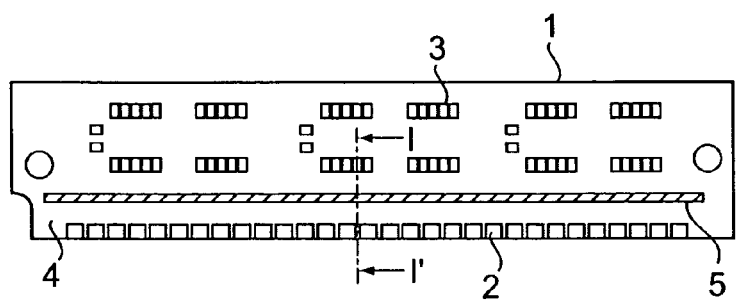
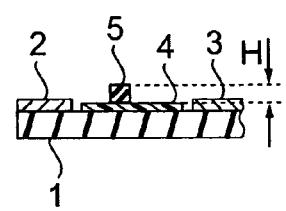
FIG. 1A  FIG. 1B
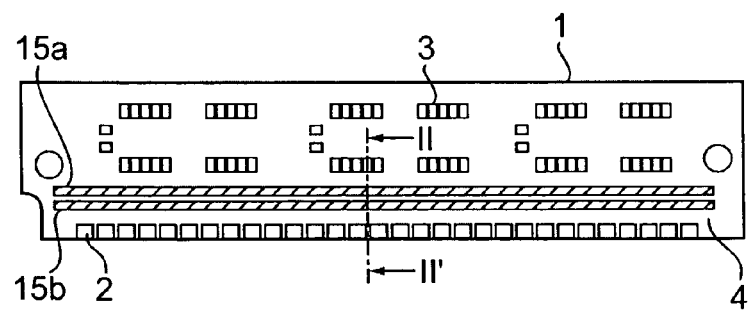
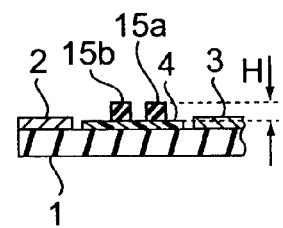
FIG. 2A  FIG. 2B

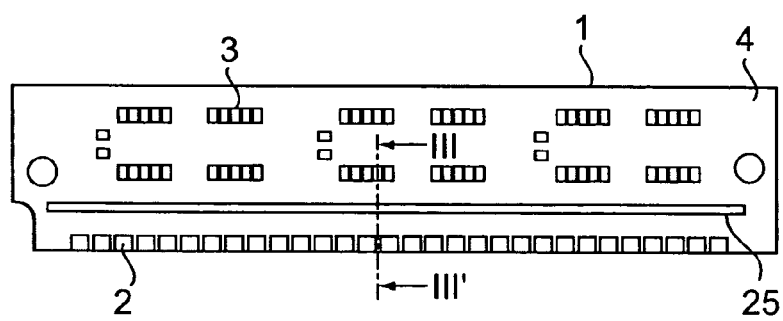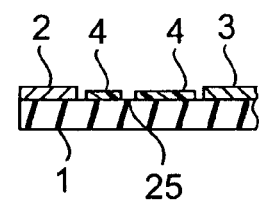
FIG. 3A  FIG. 3B
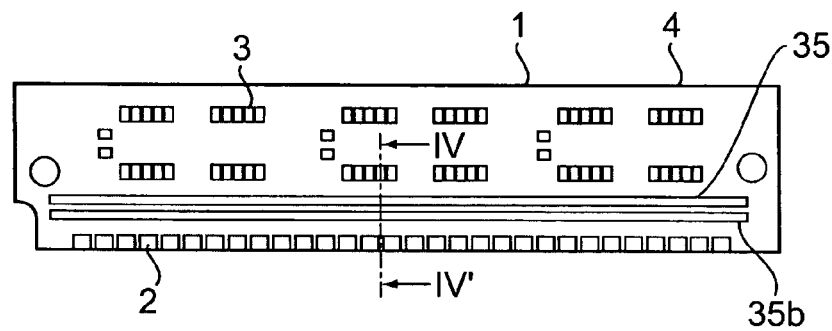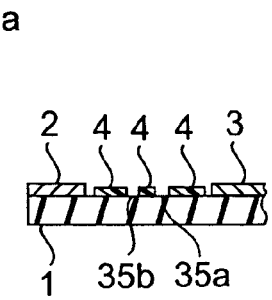
FIG. 4A  FIG. 4B

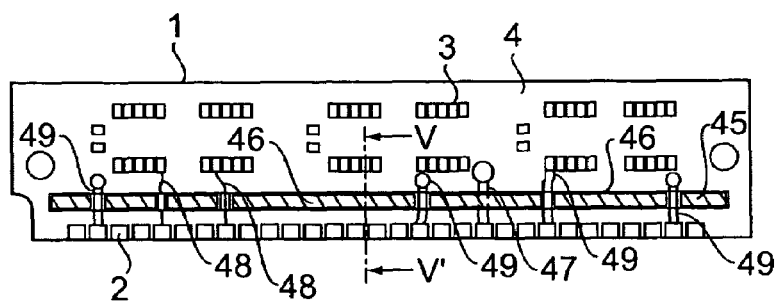 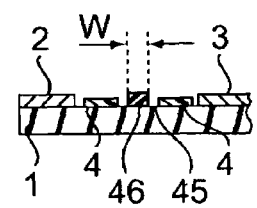
FIG. 5A  FIG. 5B
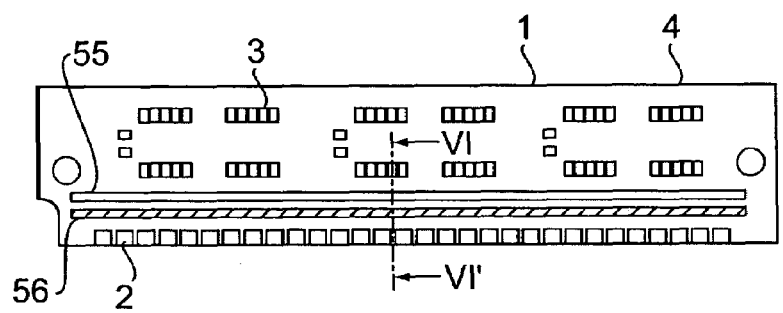 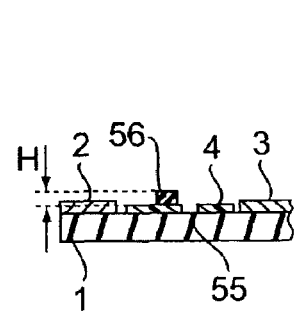
FIG. 6A  FIG. 6B

MODULE CIRCUIT BOARD FOR SEMICONDUCTOR DEVICE HAVING BARRIERS TO ISOLATE I/O TERMINALS FROM SOLDER

CROSS-REFERENCE TO RELATED APPLICATION

This application claims the priority benefit of Japanese Patent Application No. 10-354757, filed Dec. 14, 1998, the entire subject matter of which is incorporated herein of reference. This application is a divisional application of applicant's application Ser. No. 10/289,358, filed Nov. 7, 2002 now U.S. Pat. No. 6,833,509, which is division of applicant's application Ser. No. 10/022,285, filed Dec. 20, 2001 now U.S. Pat. No. 6,498,306, which is division of applicant's application Ser. No. 09/450,504, filed Nov. 30, 1999, which is now patented, U.S. Pat. No. 6,420,658.

BACKGROUND OF THE INVENTION

1. Field of the Invention

The invention relates to a module circuit board including a plurality of I/O terminals disposed at an edge of the board, a plurality of soldering pads on its surface for mounting parts such as semiconductor devices, and a barrier formed on its surface to isolate the I/O terminals from solder.

2. Description of the Related Art

A module circuit board for mounting flat type package ICs using a Surface-Mounted Device includes a plurality of I/O terminals plated of gold or flash gold which is formed on its one edge, a plurality of soldering pads on its surface on which the ICs are mounted using a solder reflow process, and a solder resist film formed on the circuit board. In the solder reflow process, some problems occur. That is, during the performance of the solder reflow process, solder balls are formed from melted solder. The solder ball is moved on the resist film, which is disposed between the pads and the terminals. If the solder ball reached the terminal is adhered to the terminal, the circuit board will be defective. To avoid this problem, the following countermeasure has been taken.

(1) To avoid the formation of the solder ball, some conditions of the reflow process, including the temperature, are changed.

(2) To prevent the solder ball from reaching the terminal, the terminal is sealed with a tape before the reflow process.

In the measure (1), the frequency that the solder ball is formed can be decreased. However, it is difficult to eliminate the formation of the solder ball completely. In the measure (2), the cost performance is not effective because of sealing and removing the tape. Further, if the tape adhesive remains on the terminal, it becomes a problem when the board is connected to the other parts.

SUMMARY OF THE INVENTION

An objective of the invention to provide a module circuit board for a semiconductor device having barriers to isolate I/O terminals from solder.

To achieve this objective, a module circuit board for a semiconductor device includes a plurality of pads, on which the semiconductor device is mounted, formed on of the board, a plurality of terminals formed on a side edge of the board, a resist film covering an area between the pads and the terminal on the board and a barrier formed between the pads and the terminals.

BRIEF DESCRIPTION OF THE DRAWINGS

The invention will be more particularly described with reference to the accompanying drawings in which:

FIG. 1(a) is a plan view of a module circuit board of the first embodiment of the invention, FIG. 1(b) is an enlarged sectional view taken along line I-I' shown in FIG. 1(a), FIG. 2(a) is a plan view of a module circuit board of the second embodiment of the invention, FIG. 2(b) is an enlarged sectional view taken along line II-II' shown in FIG. 2(a), FIG. 3(a) is a plan view of a module circuit board of the third embodiment of the invention, FIG. 3(b) is an enlarged sectional view taken along line III-III' shown in FIG. 3(a), FIG. 4(a) is a plan view of a module circuit board of the fourth embodiment of the invention, FIG. 4(b) is an enlarged sectional view taken along line IV-IV' shown in FIG. 4(a), FIG. 5(a) is a plan view of a module circuit board of the fifth embodiment of the invention, FIG. 5(b) is an enlarged sectional view taken along line V-V' shown in FIG. 5(a), FIG. 6(a) is a plan view of a module circuit board of the sixth embodiment of the invention, and FIG. 6(b) is an enlarged sectional view taken along line VI-VI' shown in FIG. 6(a).

DETAILED DESCRIPTION OF THE PREFERRED EMBODIMENTS

Referring to FIGS. 1(a) and 1(b), a module circuit board 1 for mounting a Surface-Mounted Device includes a plurality of I/O terminals 2 plated of gold or flash gold which is formed on its one edge and a plurality of soldering pads 3 on its surface on which some semiconductor devices are mounted using a solder reflow process. As the other area of the board 1 is covered by a solder resist film 4 having a thickness of 20 µm, the solder layer can not be formed on the other area of the board 1 which is covered by the film 4. A wall 5 is formed on the resist film 4 between the terminals 2 and pads 3, along the terminals 2. Preferably, the wall 5 is disposed in the middle between the terminals 2 and pads 3, and preferably a little closer to the terminals 2. The wall 5 has a length of about 10 mm, so as to extend past the group of the terminals 2, and has a width of about 0.5 mm. The wall 5 acts as a barrier to isolate the terminals 2 from solder. The wall 5 is formed using a screen print method, with resin having high viscosity, such as epoxy. The height h of the wall is not less than 0.1 mm which is larger than a diameter of a solder ball which is formed during a solder reflow process.

According to this first embodiment, if the solder ball is formed when the ICs are mounted on the board 1 during the solder reflow process, the solder ball can not get to the terminals 2 because the wall 5 acts as the barrier. Therefore, as it is not necessary to seal the terminals 2 with tape, process time can be reduced, and the tape adhesive does not remain on the terminals 2. As a result, the number of defective boards is dramatically decreased, and the uniform quality of the board can be achieved.

Referring to FIGS. 2(a) and 2(b), two walls 15a, 15b are formed on the resist film 4 between the terminals 2 and pads 3, along the terminals 2. The first wall 15a is disposed parallel to the second wall 15b. Each wall has a length of about 10 mm, so as to extend past the group of the terminals 2, and has a width of about 0.5 mm. The walls 15a, 15b act as barriers to isolate the terminals 2 form solder. The walls 15a, 15b are formed by the same method described in the first embodiment. The height h of each wall is not less than 0.1 mm, which is larger than a diameter of a solder ball which is formed during a solder reflow process.

According to the second embodiment of the invention, if the solder ball is formed when the ICs are mounted on the board 1 using the solder reflow process, the solder ball can not get to the terminals 2 because the first wall 15a and the second wall 15b act together as the barrier. Further, if the solder ball runs over the first wall 15a, the solder ball will be stacked between the first wall 15a and the second wall 15b because of a surface tension effect of the solder ball. Therefore, the barrier effect of the second embodiment is more than twice a high as the first embodiment.

Referring to FIGS. 3(a) and 3(b), an elongated trench 25 is formed on the resist film 4 between the terminals 2 and pads 3, along the terminals 2. The surface of the board 1 is exposed at the bottom of the trench 25. The trench 25 acts as a barrier to isolate the terminals 2 from solder. The trench 25 has a width of about 0.5 mm, and is formed with the resist film 4. The length of the trench is a little longer than the width of a terminal group, i.e., it extends past the terminal group.

According to this third embodiment of the invention, if the solder ball is formed when the ICs are mounted on the board 1 using the solder reflow process, the solder ball can not get to the terminals 2 because the solder ball will be stacked in the trench 25 which acts as the barrier. Further, since the trench is formed together with the resist film 4, no additional process to fabricate the board is necessary, as compared to the first and second embodiments. Furthermore, as the circuit patterns formed on the board 1 are plated electrolessly with flash Au, the reflowed solder does not have any influence on the circuit patterns even if the solder runs into the trench 25.

Referring to FIGS. 4(a) and 4(b), two elongated trenches 35a, 35b are formed on the resist film 4 between the terminals 2 and pads 3, along the terminals 2. The surface of the board 1 is exposed at the bottom of the trenches 35a, 35b. The first trench 35a is disposed and spaced parallel to the second trench 35b. The distance between the trenches 35a, 35b is about 1 mm. The trenches 35a, 35b act as barriers to isolate the terminals 2 form solder. Each trench 35a, 35b has a width of about 1 mm, and is formed with the resist film 4. The length of each trench is a little longer than the width of a terminal group, i.e., it extends past the terminal group.

According to this fourth embodiment of the invention, if the solder ball is formed when the ICs are mounted on the board 1 using the solder reflow process, the solder ball can not get to the terminals 2 because the solder ball will be stacked in the first trench 35a. If the solder ball runs over the first trench 35a, the solder ball will be stacked in the second trench 35b. Even if the distance between the trenches 35a, 35b is smaller than the diameter of the solder ball, the solder ball will be stacked in the both trenches 35a, 35b because of a surface tension effect of the solder ball. Therefore, the barrier effect of the fourth embodiment is more than twice as high as the third embodiment. Furthermore, similar to the third embodiment, no additional processes to fabricate the board are necessary, as compared to the first and second embodiments because the trench is formed together with the resist film 4.

Referring to FIGS. 5(a) and 5(b), an elongated trench 45 is formed on the resist film 4 between the terminals 2 and pads 3, along the terminals 2. A metal pattern 46 made of Cu is formed on the board 1 in the trench 45. The thickness of the metal pattern 46 is about 30 µm. The metal pattern 46 has a width of about 0.1 mm, and is formed with the other circuit patterns formed on the board. The metal pattern 46 can be connected to a power supply line 47 formed on the board. However, the metal pattern 46 is not connected to some signal lines 48 and some ground lines 49. The metal pattern 46 acts as a barrier to isolate the terminals 2 form solder.

According to the fifth embodiment of the invention, if the solder ball is formed when the ICs are mounted on the board 1 by the solder reflow process, the solder ball can not get to the terminals 2 because the solder ball will adhered to the metal pattern 46, which acts as the barrier. Further, as the metal pattern 46 is formed together with the other circuit pattern such as the power supply line 47, no additional processes to fabricate the board are necessary.

Referring to FIGS. 6(a) and 6(b), an elongated trench 55 is formed on the resist film 4 between the terminals 2 and pads 3, along the terminals 2. Furthermore, a wall 56, which is formed using the same method described in the first and second embodiments is formed on the resist film 4. The wall 56 is disposed between the trench 55 and terminals 2. The height h of the wall is not less than 0.1 mm, which is larger than a diameter of a solder ball which is formed during the solder reflow process. The surface of the board 1 is exposed at the bottom of the trench 55. The trench 55 acts as a first barrier to isolate the terminals 2 form solder. The wall 56 acts as a second barrier to further isolate the terminals 2 from solder. Each length of the trench 55 and the wall 56 is a little longer than the width of a terminal group, i.e., they extend past the terminal group.

According to the sixth embodiment of the invention, if the solder ball is formed when the ICs are mounted on the board 1 using the solder reflow process, the solder ball can not get to the terminals 2 because the solder ball will be stacked in the trench 55. If the solder ball runs over the trench 55, the wall 56 as the second barrier dams the solder ball. If the distance between the trench 55 and the wall 56 is smaller than the diameter of the solder ball, the solder ball will be stacked between the trench 55 and the wall 56 strongly because of a surface tension effect of the solder ball.

While the present invention has been described with reference to illustrative embodiments, this description is not intended to be construed in a limiting sense. Various modifications of the illustrated embodiments, as well as other embodiments of the invention, will be apparent to those skilled in the art on reference to this description. For example, although the walls 5, 15a, 15b, 56 are formed of resin in the first, second and sixth embodiment, these walls 5, 15a, 15b, 56 can be formed of metal, such as gold to which the solder can be adhered easily. If the wall is formed of gold, the solder ball is not only dammed by the wall but also will be adhered onto the wall. Such a gold wall may be pasted on the resist film. Further, although two walls are formed in the second embodiment, it is possible to further increase the number of walls. Furthermore, although two trenches are formed in the fourth embodiment, it is possible to further increase the number of trenches. Therefore, the appended claims are intended cover any such modifications or embodiments as falls within the true scope of the invention.

What I claimed is:

1. A circuit board for a semiconductor device, comprising:
a plurality of pads for the semiconductor device on which the semiconductor device is to be mounted, said pads being formed on the circuit board, and said pads being disposed only in a first line, which is in parallel to one of the sides of the circuit board;
a plurality of terminals for an external device formed on the side edge of the circuit board, said terminals being disposed only in a second line, which is in parallel to said first line of said pads,
whereby no pads and terminals are formed in line along other sides of the circuit board, and the pads in the first line and the terminals in the second line are always in parallel;
a resist film covering an area on the circuit board between said pads and said terminals; and
a barrier formed between said first line of said pads and said second line of said terminals, said barrier including a plurality of line-shaped trench extending along said terminals, and said trenches being formed in said resist film,
wherein the entire surface of the circuit board in each trench is exposed.

2. A circuit board for a semiconductor device as claimed in claim 1, wherein said trenches are parallel to each other.

3. A circuit board for a semiconductor device as claimed in claim 1, wherein a distance between trenches is 1 mm.

4. A circuit board for a semiconductor device as claimed in claim 3, wherein said terminals are disposed in a certain length which is shorter than a length of said barrier.

5. A circuit board for a semiconductor device as claimed in claim 3, wherein a depth of the barrier equals the thickness of the resist film.

6. A circuit board for a semiconductor device as claimed in claim 3, wherein each trench had a width of 1 mm.

7. A circuit board for a semiconductor device as claimed in claim 6, wherein said terminals are disposed in a certain length which is shorter than a length of said barrier.

8. A circuit board for a semiconductor device as claimed in claim 6, wherein a depth of the barrier equals the thickness of the resist film.

9. A circuit board for a semiconductor device as claimed in claim 1, wherein each trench had a width of 1 mm.

10. A circuit board for a semiconductor device as claimed in claim 9, wherein said terminals are disposed in a certain length which is shorter than a length of said barrier.

11. A circuit board for a semiconductor device as claimed in claim 9, wherein a depth of the barrier equals the thickness of the resist film.

* * * * *